July 14, 1959 S. KAGAN 2,895,045

RADIO RECEIVER WITH TRANSISTORIZED AUDIO-DETECTOR AND AUTOMATIC GAIN CONTROL CIRCUITRY

Filed Sept. 26, 1957 2 Sheets-Sheet 1

INVENTOR.
SHOLLY KAGAN
BY Alden D. Redfield
Charles M. Hogan
ATTORNEYS.

INVENTOR.
SHOLLY KAGAN
BY Alden D. Redfield
Charles M. Hogan
ATTORNEYS.

United States Patent Office

2,895,045

Patented July 14, 1959

2,895,045

RADIO RECEIVER WITH TRANSISTORIZED AUDIO-DETECTOR AND AUTOMATIC GAIN CONTROL CIRCUITRY

Sholly Kagan, Boston, Mass., assignor to Avco Manufacturing Corporation, Cincinnati, Ohio, a corporation of Delaware Application September 26, 1957, Serial No. 686,379

10 Claims. (Cl. 250—20)

The present invention relates to radio receivers generally, and particularly to improvements in automatic gain control and transistorized detector-audio circuitry.

A primary object of the invention is to provide the combination (Fig. 2) of a common emitter detector stage D.C. coupled to an emitter-follower audio amplifier stage in cascade therewith, and an emitter load in the latter, so constructed and arranged that, in the absence of input signals, neither transistor involved is biased in the forward direction, whereby current drain from the power source is reduced to a minimum. The attainment of this object is of particular significance in such applications as portable broadcast receivers, but the invention is not limited in utility to such receivers.

Another object of the invention is to provide, in the above-mentioned combination, feedback for direct currents and audio frequencies only, thereby to enhance fidelity and stability.

A further object of the invention is to realize, in such combination, the advantages of power detection, with both voltage and current amplification in the detector.

Among the objects of the invention are the utilization of such emitter load as a source of automatic gain control voltage, and the provision of a temperature-stabilizing resistor between emitter and base of the audio amplifier stage transistor, said emitter being so arranged as not to present any substantial load to the collector of the detector transistor.

Figure 1:
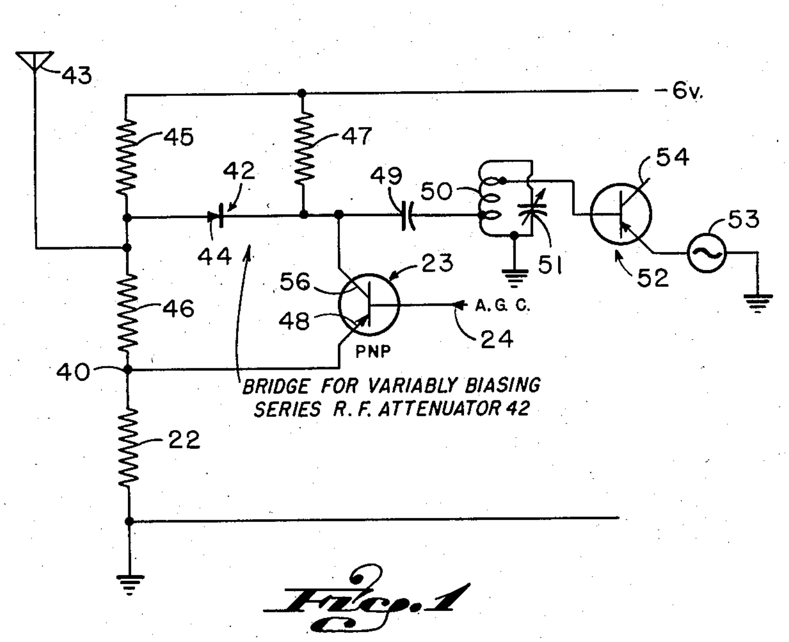

Another principal object of the invention is to provide a delay voltage point at the input (Fig. 1) of a receiver (i.e., a voltage-delayed automatic gain control reference) and to operate the detector-audio amplifier combination in such a way that the emitter load voltage of the audio amplifier stage (Fig. 2) is substantially equated to the delay voltage (across resistor 22, Fig. 1). That is, the output of the audio amplifier (Fig. 2) is made independent of all factors, such as temperature conditions, other than the magnitude of the delay voltage (across resistor 22, Fig. 1). In furtherance of this object, there is provided a novel bridge-type signal attenuator (Fig. 1) including an automatic gain control (i.e., AGC) amplifying transistor (23) in one of its branches. This amplifying transistor has its emitter connected to the delay voltage point and its base connected (at 24) to the audio output emitter load (Fig. 2) via a filter. When the AGC amplifying transistor (23) is non-conducting, the full input signal voltage is applied to the receiver high frequency stages or mixer without attenuation. Increase in input signal voltage from zero causes the audio amplifier emitter to develop an AGC voltage (at point 24, Figs. 1 and 2) substantially equal to the delay voltage (across resistor 22). When the AGC voltage (at point 24) exceeds the value of such delay voltage, then the base of the PNP type AGC amplifying transistor becomes negative relative to its emitter, so that the AGC amplifying transistor becomes conductive and controls the bridge attenuator in such a way that input signals of sufficient intensity to cause such excess are attenuated. Thus very considerable uniformity in over-all gain of the receiver is achieved, over a wide range of input signal intensities.

Another significant object of the invention is to provide a signal attenuator (Fig. 1) comprising three resistor arms and the emitter-collector circuit of a transistor (such circuit being the fourth arm), with a diode connected between the two arm junctions. This attenuator features a silicon diode which operates in such a way, in association with the other circuit elements, that under weak input signal conditions there is a small forward bias across the diode, so that input signals pass through the diode without attenuation. On the other hand, under input signal conditions of high intensity, the attenuator operates in such a way as to impress a reverse voltage across the diode so that input signals are substantially attenuated. The relationship between Figs. 1 and 2 resides in the fact that the Fig. 1 signal attenuator is controlled by the AGC amplifying transistor 23, which in turn is controlled by the voltage (at 24) developed across the audio amplifier emitter load of Fig. 2.

Another major object of the invention is to provide, in combination (Fig. 3) audio load means (also shown in Fig. 2) for producing an AGC potential, mixer means (Fig. 3) controlled by said potential, a silicon diode signal attenuator (32, Fig. 3), and means (including transistor 33) controlled by the mixer for varying the bias on the diode in such a manner as to vary signal attenuation in proportion to the variation in input level, once a predetermined input signal input intensity is exceeded.

A further object of the invention is to provide signal attenuators which advantageously utilize the voltage-current characteristics of silicon diodes to achieve a wide range of signal attenuation.

Figure 3:
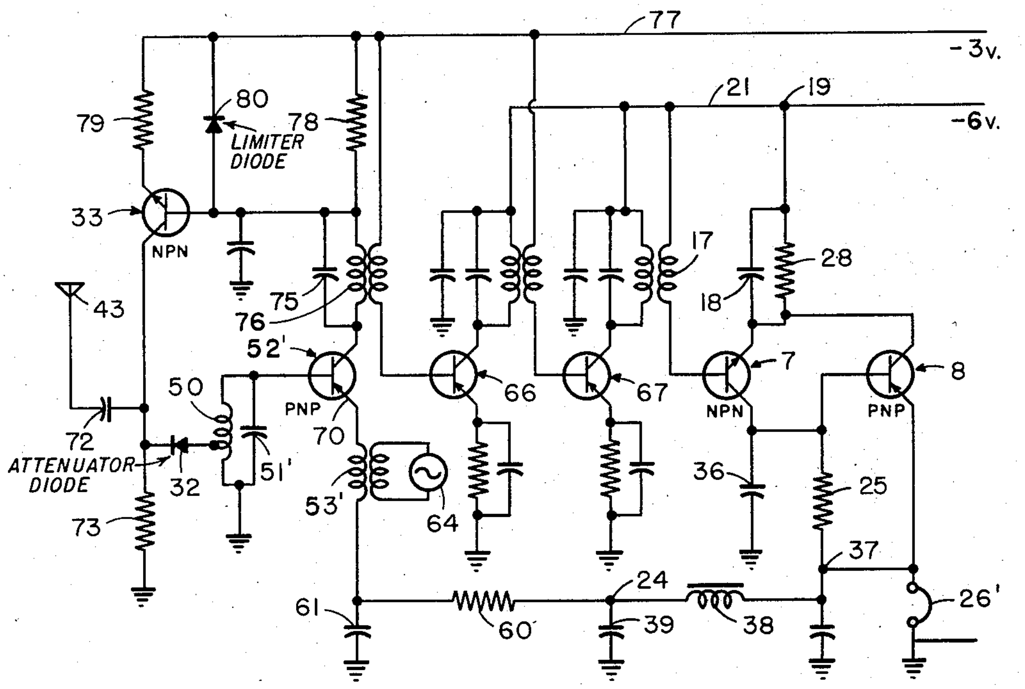

With particular reference to Fig. 3, an object of the invention is to provide a radio receiver which offers the advantages of low current drain, wide range of dynamic control, and improved signal-to-noise ratio, together with good fidelity and stability and transistorization characterized by considerable independence of ambient temperature conditions.

Figure 2:
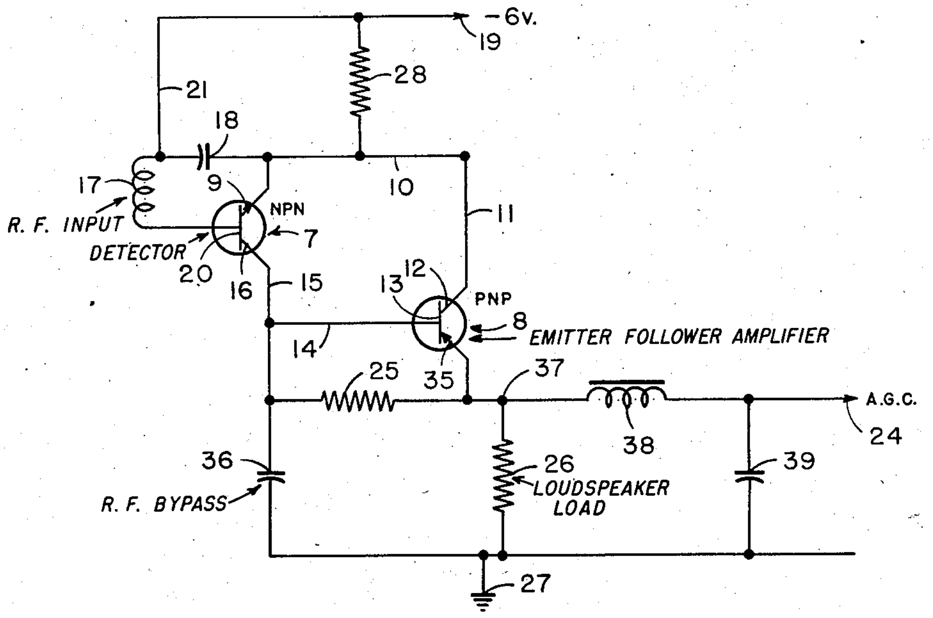
Figure 4:
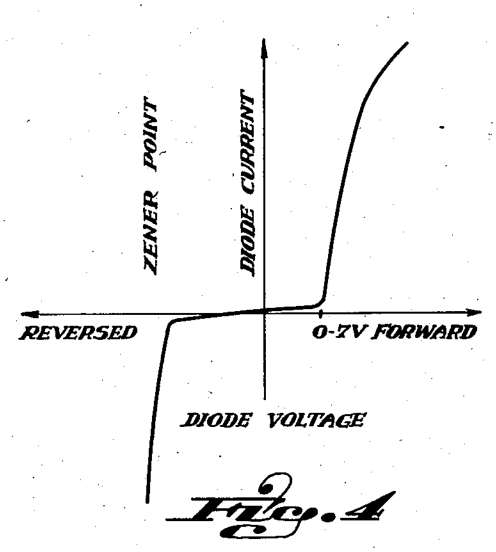
Figure 5:
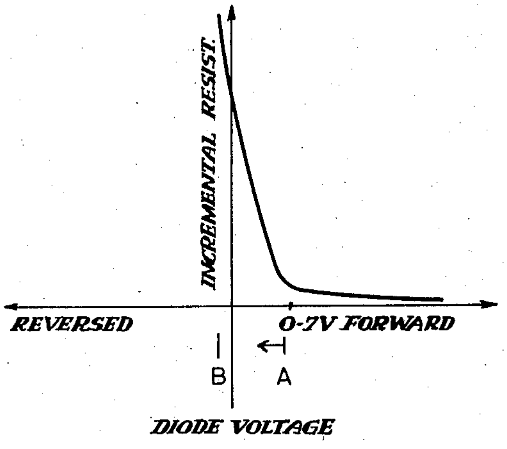

For a better understanding of the present invention, together with other and further objects, advantages, and capabilities thereof, reference is made to the following description of the accompanying drawings, in which Figs. 1, 2, and 3 are circuit schematics. Fig. 1 discloses my novel signal attenuating circuit. Fig. 2 discloses my novel detector-audio circuit, providing a source of AGC control voltage. Figs. 1 and 2 show in combination the application of the AGC control voltage by its source to the Fig. 1 attenuator. Fig. 3 discloses my novel radio receiver including the Fig. 2 detector-audio combination but applying the AGC voltage to the mixer and utilizing an input signal attenuator which is different from that shown in Fig. 1. Figs. 4 and 5 are curves showing characteristics of the silicon diode which the invention exploits and provided as an aid in explaining the operation of the invention.

Referring now first to Fig. 2, there is shown a novel common emitter power detector and emitter-follower type audio amplifier, in combination, the emitter load functioning as a source of automatic gain control voltage. This combination is directed to the purpose of providing single-ended circuitry characterized by as many advantages of push-pull as possible. A particular objective is to minimize battery drain in the absence of input signals. To that end a complementary combination of NPN type common-emitter transistor 7 and PNP type emitter-follower type transistor 8 are provided, the emitter 9 of transistor 7 being directly connected by conductors 10 and 11 to the collector 12 of transistor 8, and the base 13 of transistor 8 being directly connected by conductors 14 and 15 to the collector 16 of transistor 7. The first stage therefore is a common emitter power detector circuit with voltage and current amplification. Input signals to detector 7 are applied to its base-emitter circuit, from an intermediate frequency amplifier system, via a suitable coupling circuit comprising a transformer having a secondary 17. Included in the coupling circuit is a series capacitor 18. The output signals of the detector 7, comprising the derived modulation components, are applied to the audio amplifier transistor 8, which, as has been indicated, is arranged in the emitter-follower connection.

The reference numeral 19 (Fig. 2) represents the negative terminal of a suitable battery or other current source (at −6 volts, for example). The base 20 of detector transistor 7 is biased negatively relative to the collector (that is, the collector is biased in the reverse direction) by a series circuit comprising terminal 19, conductor 21, direct current path 17, base 20, collector 16, resistor 25, resistor 26, and ground connection 27 (which may be understood to be connected to the positive terminal of the power or current source). Accordingly, one terminal of secondary 17 is connected by conductor 21 to terminal 19 and the other terminal of secondary 17 is connected to base 20. The collector 12 of PNP audio amplifying transistor 8 is biased negatively relative to its base by connection of a resistor 28 between such collector and terminal 19.

The detector stage has no fixed forward emitter bias. Resistor 28, connected between conductor 10 and negative voltage source terminal 19, provides inverse feedback for direct currents and audio frequencies but is by-passed to the effectively A.C. ground point 19 by capacitor 18. That is, emitter 9 is grounded for radio frequencies only, while base 20 is grounded for audio frequencies and direct currents. Resistor 28 can be made variable and used as a volume control.

Temperature-stabilizing resistor 25 is connected in circuit with conductor 14 between base 13 and emitter 35 of the audio amplifier transistor 8. The primary purpose of this resistor is to stabilize transistor 8. This resistor being connected between points at nearly the same potential, it presents substantially no load to the collector of the detector transistor 7. The radio frequency portion of the detector output is filtered out by a shunt capacitor 36, connected in circuit between collector 16 and ground 27.

In combination with the detector and audio amplifying transistors there is provided an emitter load impedance 26, shown symbolically in Fig. 2 as a resistor. This load may consist, for example, of a set of head-phones having the desired audio impedance and substantial D.C. resistance. Load 26 with its associated filter network constitutes a source of AGC voltage. Its terminal 37, connected to emitter 35, is connected to point 24 (base of AGC amplifying transistor 23 of Fig. 1) by a filter comprising series choke 38 and shunt audio by-pass capacitor 39.

Coming now to a description of the operation of the Fig. 2 circuit, substantially no collector current flows in detector transistor 7 when no I.F. system output signal is applied to the detector, there being no forward bias on that transistor. Therefore there is substantially no voltage drop across resistor 25 and no forward bias on the audio transistor 8. The reason for this is that current flow through the detector collector load resistor 25 is the only source of forward bias for the emitter-base junction of audio amplifier transistor 8. In the absence of received signals, therefore, neither transistor (7 or 8) is conductive, and there is therefore substantially no current drain from the power supply by the detector-audio system. This is qualified in the sense that a negligible leakage current flow on the order of 50 to 100 microamperes is found in practice.

As signals are applied to the detector input, both transistors 7 and 8 become conductive, and emitter-follower transistor 8 provides current amplification. That is to say, the rectified current of the detector, flowing in resistor 25, causes forward bias to be applied to emitter 35. This rectified current is further amplified by the base amplification factor of transistor 8, and a large current, containing both D.C. and modulation components, then flows in load 26, rendering point 37 and terminal 24 more negative. The AGC voltage at terminal 24 is amplified and employed to control the input signal attenuation network illustrated in Fig. 1. As signals applied to the detector increase in intensity, the voltage at terminal 24 becomes increasingly negative up to a predetermined value—i.e., the voltage delay value at point 40 (Fig. 1). This point 40 is the delayed AGC voltage point. That is to say, input signals to the receiver and the detector are applied without attenuation until the AGC source voltage developed at point 24 (Fig. 2) attains a negative value equal to the voltage at point 40 (Fig. 1). When the voltage at point 24 becomes still more negative, AGC action occurs and input signals to the receiver are attenuated (as will be seen in the description of Fig. 1). The reason for this is that transistor action in transistor 23 occurs, causing input signal attenuation in the Fig. 1 circuit.

The AGC source voltage at point 24 is rendered independent of temperature conditions because it is clamped to the potential at the delay voltage point by the emitter-base junction of transistor 23, functioning for that purpose as a negative clamping circuit.

Referring now to the construction of the Fig. 1 signal-attenuation circuit, the diode attenuator there shown provides a very wide dynamic range of control. Parenthetically, the system of Figs. 1 and 2 is not, generically speaking, limited to transistor circuitry. However, it is advantageously used in transistorized receivers because it is compatible with the voltages and currents commonly found in such receivers.

The use of the Fig. 1 circuit, in supplement to conventional AGC control methods, such as mixer control, provides an AGC control range in excess of 100 db, without detriment from envelope distortion so commonly experienced with transistor receivers.

A silicon diode 42 is connected between the antenna 43 and the input to the mixer stage of the receiver in a straightforward path so far as radio frequencies are concerned, the anode 44 of the diode being connected directly to the antenna. So far as direct currents are concerned, such diode is placed across a bridge circuit comprising resistors 45, 46, and 47, and the emitter-collector circuit of AGC amplifying transistor 23. Resistors 45, 46, and 22 are connected in series as a voltage divider between the negative terminal of the power source and ground (point of reference potential). The series combination of resistors 45 and 46 is paralleled by a series combination of resistor 47 and the emitter-collector circuit of transistor 23. Diode 42 is connected between the junction of bridge arms 45, 46 and the junction of the bridge arms comprising element 47 and the emitter-collector circuit of transistor 23. It will be seen that resistor 22 is in series with the bridge network and is so placed in order to provide a reference bias for the emitter 48 of transistor 23. This bias is the AGC delay voltage and is of such magnitude as to render transistor 23 non-conductive until the AGC voltage produced at point 24 exceeds the delay voltage across resistor 22.

Transistor 23 has its collector connected to the junction of resistor 47 and the cathode of diode 42, its emitter connected to the junction of resistors 22 and 46, and its base connected to AGC source point 24. The AGC control voltage from source 24 is employed to change the state of transistor 23 from one of open circuit to one of heavy conduction when input signals to the receiver exceed a predetermined magnitude. Thus it will be seen that the emitter-base junction of transistor 23 functions as a negative clamping circuit with respect to the potential at AGC source point 24. That is, when such potential exceeds that at point 40, transistor action occurs in transistor 23.

Parenthetically, the mixer input comprises a conventional coupling capacitor 49 and a tuned inductance-capacitance circuit 50, 51, and the mixer transistor 52 has its base connected to a tap on inductance 50 and its emitter arranged in series with a suitable local oscillator 53, the output being taken from collector 54.

The Fig. 1 signal attenuation network, or combination of bridge circuit and diode, is so arranged that for low input signal levels transistor 23 is open-circuited and silicon diode 42 conducts heavily, the potential at the collector of transistor 23 and the cathode of diode 42 being more negative than that of anode 44 (illustrative values of such potentials being −3 volts for the anode 44 and −3.7 volts for collector 56 of transistor 23).

The voltage divider network 45, 46, and 22 is so arranged that the voltage at point 40 is stable (at −1 volt, for example) and the voltage at anode 44 is also stable (at −3 volts, for example).

Referring now to the operation of the Fig. 1 circuit, when input signal levels are low the diode 42 conducts heavily and passes the input signals directly to the mixer without substantial attenuation, the D.C. electron path in such case—comprising the elements 47, 42, 46, and 22—being conductive, and transistor 23 being non-conducting. Diode 42 conducts heavily because it has a forward voltage across it.

In case of strong input signals, the voltage from AGC source point 24, applied to the base of transistor 23, produces transistor action and collector current flow in transistor 23, so that the potential at collector 56 and the cathode of diode 42 becomes less negative and approaches the potential at the base of transistor 23—in any case a potential substantially less negative than that of anode 44 of the diode. This action applies a reverse bias to the diode 42, rendering it effectively a high resistance and strongly attenuating input signals passing from the antenna to the mixer.

It will be seen from the foregoing that the diode 42 is controlled from its low forward resistance state to its high reverse resistance state, so that as the incoming signals from the antenna pass through the diode 42, the insertion loss changes with the control voltage from AGC source point 24, and therefore with received signal level.

The signal attenuating circuits herein disclosed take unique advantage of the characteristics of the silicon diode. Examining the voltage-current characteristics shown in Fig. 4, wherein voltages are plotted as abscissae and currents as ordinates on a frame of Cartesian coordinates, it will be recognized that the curve has a sharp break at the Zener point and another sharp break at the 0.7 volt forward bias point. The latter point is advantageously utilized by the Fig. 1 circuit.

Referring now to Fig. 5, in which there is plotted the incremental resistance of this diode (in ordinate) vs. forward and reverse bias voltage values as abscissae, it should be observed that the incremental resistance is high up to the forward break point in region A, whereat it becomes quite low with further increase in forward bias.

Now making the nexus between the Fig. 5 characteristic and the operation of the Fig. 1 circuit, diode 42 is biased in the forward direction in the absence of any input signals, and therefore the diode operates in or to the right of the region indicated by the letter A in Fig. 5. As the input signals become more intense and finally attain the strong signal condition, the Figs. 1 and 2 circuits go through these steps: the AGC potential 24 becomes more negative, finally exceeding the delay voltage across resistor 22; transistor 23 becomes conductive; the forward bias across diode 42 drops and finally becomes a reverse bias as transistor 23 conducts heavily; the diode progressively operates on portions of its characteristic to the left of region A in Fig. 5 and finally operates in region B, Fig. 5, the progression being as indicated by the arrow in that figure.

In the construction of the Fig. 1 circuit, resistors 45 and 46 are made very much lower in value than resistor 47, so that they predominate in control of the current through resistor 22, thus assuring that such current does not materially change over the operating dynamic range of the system. Thus there is fixed a delay voltage across resistor 22 which remains fairly constant regardless of input signal level.

Another way of viewing the operation of the Fig. 1 circuit is that the bridge is severely unbalanced when input signals are absent. Increase of intensity of such signals progressively restores the bridge balance and renders diode 42 less conductive.

As previously noted, the Fig. 1 circuit is of primary utility as a supplement to conventional AGC control. In the practical application of the Fig. 1 system alone to a transistor mixer, certain limitations are experienced. The variable gain element 42 being in the form of an attenuator between antenna and input stage, the Fig. 1 system fairly insures constant output signal regardless of input signal level. However, it does not effect any significant change in signal-to-noise ratio. A system which has a constant output but a fairly low signal-to-noise ratio regardless of input signal level is subject to limitations, and it is the purpose of the Fig. 3 embodiment to provide means for overcoming this limitation of the Fig. 1 attenuating circuit.

In Fig. 3 there are shown: the detector-audio combination featuring transistors 7 and 8, and the elements 17, 18, 21, 25, 26′, 28, 36, 37, 38, and 39—all identical with the Fig. 2 showing, head-phones 26′ being utilized as an emitter load in lieu of resistor 26 of Fig. 2. Fig. 3 shows the point 24 across which AGC voltages appear. This voltage is further filtered by a network comprising series resistor 60 and shunt capacitor 61.

In Fig. 3 certain reference numerals are primed to indicate the similitude of the circuits they respectively designate to corresponding circuit elements in Fig. 2, the priming expedient being employed to dispense with further description.

In Fig. 3 the AGC voltage is applied to the emitter of mixer transistor 52′, thereby achieving direct AGC control of the mixer. The mixer in turn, in addition to its usual functions, also controls the AGC amplifying transistor 33, which in turn controls the signal attenuating diode 32. Diode 32 performs generally the same function as diode 42 in Fig. 1. In Fig. 1 diode 42 is controlled by controlling the voltage at its cathode through the use of AGC amplifying transistor 23. In Fig. 3 diode 32 is controlled by controlling the voltage at its cathode through the use of AGC amplifying transistor 33. It should be noted that diodes 42 and 32 are connected with opposite polarity in Figs. 1 and 3.

Diverting for the moment to refer to the Fig. 3 radio receiver as a whole, it comprises an antenna 43, signal attenuator 32, a mixer stage including transistor 52′, a local oscillator 64 coupled to the mixer by a transformer including secondary 53′, and conventional intermediate frequency stages in cascade between the mixer and the second detector transistor 7, such I.F. stages comprising transistors 66 and 67. Further description of the intermediate frequency stages is not here requisite or desirable.

In the Fig. 3 circuit the signal attenuating diode 32 is placed between the antenna coupling capacitor 72 and the tuned input circuit 50, 51′ of the mixer, with the cathode of the diode poled on the antenna side. Under no-signal conditions the diode 32 is forwardly biased by current in resistor 73, connected between its cathode and ground. Resistor 73 is in series with the collector of an NPN type AGC amplifying transistor 33. In series between the tuned output circuit (capacitor 75—inductor 76) of PNP type mixer transistor 52' and power supply line 77 (at —3 volts, for example) is a collector load resistor 78. The current flowing in this resistor controls that flowing in the emitter-base junction of AGC amplifying transistor 33, which has its base connected to the junction of the elements 76 and 78, its collector connected to resistor 73, and its emitter connected to the power line 77 through a resistance 79. A silicon diode limiter 80 is connected across resistor 78 in order to limit the voltage drop across that resistor to a predetermined value—say 0.7 volt, for example.

Under no-signal or weak signal conditions mixer 52' is fully conductive and a substantial collector current flows across resistor 78, biasing the emitter of AGC transistor 33 negatively with respect to its base, so that AGC transistor 33 is strongly conductive and a substantial collector current flows in collector load 73, biasing diode 32 in the forward direction so that the signal path from the antenna to the mixer is only slightly resistive and input signals are not substantially attenuated. As input signal intensity increases, the mixer 52' is gradually cut off by the application of voltage from the AGC source, and thus the advantage of AGC control of the mixer is realized. As this control occurs, current flow through the collector of the mixer and through resistor 78 is also affected. The forward voltage developed across resistor 78, limited by diode 80, is reduced so that the base-emitter junction of AGC amplifying transistor 33 becomes less conductive and there is less current flow in collector load 73, with the result that the forward bias across the attenuating diode 32 is reduced and input signals are progressively attenuated.

The function of limiting diode 80 is to prevent the voltage drop across resistor 78 from exceeding a predetermined value—say 0.7 volt, for example. An alternative expedient for accomplishing a satisfactory similar result would reside in the omission of limiting diode 80 and the use of an appropriate resistance in series with and connected to the collector of AGC amplifying transistor 33.

The preferred operation of the Fig. 3 circuit is such that, as perceptible input signals are received, they first cause AGC control of the mixer. Such control continues until such a level of signal intensity is attained that the voltage developed across collector load 78 drops below the predetermined voltage—say 0.7 volt, for example. Up to that input level there will be no effect on the signal attenuating diode 32. This operation is compatible with an input signal range on the order of 30 db, which would bring the signal-to-noise ratio to a very satisfactory level. Beyond that point the forward bias of the AGC amplifying transistor 33 is reduced with increasing signal level, which reduces the collector current of that transistor through resistor 73, and in turn reduces the forward bias across diode 32 until it attains a condition in which there is no forward bias at all across that diode. As such forward bias is reduced, input signals are progressively attenuated.

As previously mentioned, the forward breakdown of a silicon diode occurs at 0.7 volt. Therefore, under conditions of zero voltage across the diode, its behavior approximates that of a very high resistance on the order of megohms, and such a diode is accordingly a particularly effective means of attenuating input signals, when so controlled in the manner indicated as to exploit its breakdown characteristics.

The following illustrative circuit parameters have been found to be practical in one embodiment of the invention:

| Resistors (all 0.25 watt): | Values (ohms) |
|---|---|
| 45 | 1000 |
| 46 | 1000 |
| 22 | 390 |
| 47 | 1000 |
| 28 | 10 |
| 25 | 1000 |
| 26 | 120 |
| 79 | 91 |
| 73 | 4700 |
| 78 | 2200 |
| 60 | 1200 |

| Transistors: | Type |
|---|---|
| 23 | 2N135 G.E. |
| 52 | SB100 Philco. |
| 7 | 2N78 G.E. |
| 8 | 2N185 Texas Instrument. |
| 33 | 2N78 G.E. |
| 52' | SB100 Philco. |
| 66 | SB100 Philco. |
| 67 | SB100 Philco. |

| Capacitors: | | Values (microfarads unless otherwise stated) |
|---|---|---|
| 49 | | 0.01 |
| 18 | | 0.1 |
| 36 | | 0.01 |
| 39 | | 100 |
| 51 | micromicrofarads | 220 |
| 51' | do | 220 |
| 61 | | 20 |
| 75 | micromicrofarads | 220 |
| 72 | | 0.01 |

| Silicon diodes: | Type |
|---|---|
| 42 | TI604 Texas Instrument. |
| 32 | TI604 Texas Instrument. |
| 80 | TI610 Texas Instrument. |

| Inductances: | | Values |
|---|---|---|
| 50 | microhenries | 7 |
| 76 | do | 650 |
| 38 | henries | 1 |

| Frequencies: | | |
|---|---|---|
| Input signal | megacycles per second | 4 |
| Intermediate frequency | kilocycles per second | 455 |
| Audio frequency range | cycles per second | 300–4000 |

| Voltages: | | |
|---|---|---|
| Applied to line **77** | volts | —3 |
| Applied to line **21** | do | —6 |

| A.C. Impedance: | | |
|---|---|---|
| Load **26'** | ohms | 600 |

While there has been shown and described what is at present considered to be the preferred embodiment of the invention, it will be understood by those skilled in the art that various modifications and changes and substitutions of equivalents may be made therein within the true scope of the invention as defined by the appended claims.

What is claimed is:

1. A transistorized radio receiver comprising, in cascade, a diode signal attenuator having anode and cathode electrodes, a base-fed PNP type mixer having a base and a collector and an emitter, an intermediate frequency amplifying system, a detector, a low frequency amplifier, means for developing an automatic gain control potential and applying it to the emitter of the mixer for controlling the gain thereof, and transistor amplifying means controlled by said mixer for varying the bias on said signal attenuator from a substantial forward value to zero with increase in input signal intensity, said detector and low frequency amplifier comprising: a common emitter power detector NPN type transistor, an emitter-follower audio amplifying PNP type transistor, each of said transistors having a base and an emitter and a collector, a direct connection between the emmitter of the NPN type transistor and the collector of the PNP type transistor, a direct connection between the collector of the NPN type transistor and the base of the PNP type transistor, a power source having a negative terminal, a point of reference potential, said source having a positive terminal in circuit with said point, means for applying intermediate frequency signals to the emitter-base circuit of the NPN type transistor, means for providing a conductive direct current path from said negative terminal to the base of said NPN type transistor, a feedback resistor between said negative terminal and the interconnection of the NPN type transistor emitter and the PNP type transistor collector, a capacitor in shunt with said feedback resistor, a radio frequency by-pass capacitor between the collector of said NPN type transistor and said point of reference potential, a stabilizing resistor interconnecting base and emitter of said PNP type transistor, and an emitter load impedance between the emitter of said PNP type transistor and said point of reference potential, no fixed forward bias being applied to either emitter, whereby the current drain of said system from said power source is a minimum for the no-signal condition, said load impedance and detector being included in the means for developing an automatic gain control potential.

2. A transistorized radio receiver comprising, in cascade, a diode signal attenuator having anode and cathode electrodes, a base-fed PNP type mixer having a base and a collector and an emitter, an intermediate frequency amplifying system, a detector, a low frequency amplifier, means for developing an automatic gain control potential and applying it to the emitter of the mixer for controlling the gain thereof, and transistor amplifying means controlled by said mixer for varying the bias on said signal attenuator from a substantial forward value to zero with increase in input signal intensity.

3. In a radio receiver, a detector-audio system comprising, in combination, a common emitter power-detector NPN type transistor, an emitter-follower audio amplifying PNP type transistor, each of said transistors having a base and an emitter and a collector, a direct connection between the emitter of the NPN type transistor and the collector of the PNP type transistor, a direct connection between the collector of the NPN type transistor and the base of the PNP type transistor, a power source having a negative terminal, a point of reference potential, said source having a positive terminal in circuit with said point, means for applying intermediate frequency signals to the emitter-base circuit of the NPN type transistor, means for providing a conductive direct current path from said negative terminal to the base of said NPN type transistor, a feedback resistor between said negative terminal and the interconnection of the NPN type transistor emitter and the PNP type transistor collector, a capacitor in shunt with said feedback resistor, a radio frequency by-pass capacitor between the collector of said NPN type transistor and said point of reference potential, a stabilizing resistor interconnecting base and emitter of said PNP type transistor, and an emitter load impedance between the emitter of said PNP type transistor and said point of reference potential, no fixed forward bias being applied to either emitter, whereby the current drain of said system from said power source is a minimum for the no-signal condition.

4. In a radio receiver, the combination of a diode rectifier having anode and cathode electrodes, a transistor having an emitter and a collector and a base, a source of power, a voltage divider having intermediate terminals connected to said anode and to said emitter for fixing the potentials applied thereto, means including a resistor connected between said power source and said cathode for applying a forward bias to said cathode, and means for controlling the conductivity of said transistor to reverse said bias.

5. In a radio receiver, the combination of a diode signal attenuator, a source of AGC potential, means including a resistor for biasing such signal attentuator in the forward direction to render it a low impedance, and transistor amplifier means controlled by said source and having a collector in circuit with said resistor to vary the bias on said attenuator to render said attenuator a high impedance.

6. In a radio receiver, the combination of a diode signal attenuator, a transistor having an emitter and a base and a collector, means including a circuit of said transistor for providing a bridge to bias said diode in the forward direction, and means for applying a potential to said transistor so as to reverse said bias.

7. In a radio receiver, a device in accordance with claim 6 in which the means for providing the forward bias across the attenuator comprises a voltage divider having an AGC delay voltage point and in which the emitter is connected to said point, and a source of AGC voltage, the base being connected to said source, whereby such source is clamped to said delay voltage point to develop an AGC voltage substantially independent of all factors other than the delay voltage.

8. A signal attenuating network comprising, in combination, a signal path including a silicon diode rectifier having anode and cathode electrodes, a PNP type transistor having a base and a collector and an emitter, a point of reference potential, a first resistor connected between said emitter and said point of reference potential, a source of current having a negative terminal, second and third resistors connected between said negative terminal and the anode and cathode of said diode rectifier, respectively, a fourth resistor connected between said anode and said emitter, a direct connection between said collector and said cathode, said second, third, and fourth resistors and the emitter-collector circuit of said transistor comprising a bridge network having four arms and across which said diode rectifier is disposed, said transistor being normally non-conductive and said bridge network being so constructed and arranged that said diode is normally conductive, whereby said rectifier provides a low resistance path to signals, and means for applying a control potential to the base of said transistor to render it conductive, thereby to vary the bias on the cathode of such diode in such a way as to place a reverse bias across said diode and to present a high resistance to said signals.

9. In a radio receiver, the combination of a signal attenuating network and a detector-audio system which controls said network, said network comprising, in combination, a signal path including a silicon diode rectifier having anode and cathode electrodes, a PNP type AGC amplifying transistor having a base and a collector and an emitter, a point of reference potential, a first resistor connected between said emitter and said point of reference potential, a source of current having a negative terminal, second and third resistors connected between said negative terminal and the anode and cathode of said diode rectifier, respectively, a fourth resistor connected between said anode and said emitter, a direct connection between said collector and said cathode, said second, third, and fourth resistors and the emitter-collector circuit of said transistor comprising a bridge network having four arms and across which said diode rectifier is disposed, said transistor being normally non-conductive and said bridge network being so constructed and arranged that said diode is normally conductive, whereby said rectifier provides a low resistance path to signals, and means for applying a control potential to the base of said transistor to render it conductive, thereby to vary the bias on the cathode of such diode in such a way as to place a reverse bias across said diode and to present a high resistance to said signals; said detector-audio system comprising a common emitter power detector NPN type transistor, an emitter-follower audio amplifying PNP type transistor, each of said transistors having a base, an emitter, and a collector, a direct connection between the emitter of the NPN type transistor and the collector of the PNP type transistor, a direct connection between the collector of the NPN type transistor and the base of the PNP type transistor, said source of current having a positive terminal in circuit with said point of reference potential, means for applying intermediate frequency signals to the emitter-base circuit of the NPN type transistor, means for providing a conductive direct current path from the negative terminal of said source of current to the base of said NPN type transistor, a feedback resistor between said negative terminal and the interconnection of the NPN type transistor emitter and PNP type transistor collector, a capacitor in shunt with said feedback resistor, a radio frequency by-pass capacitor between the collector of said NPN type transistor and said point of reference potential, a stabilizing resistor interconnecting base and emitter of said PNP type transistor, and an emitter load impedance between the emitter of said PNP type transistor and said point of reference potential, no fixed forward bias being applied to either emitter, whereby the current drain of said system from said power source is a minimum for the no-signal condition, said emitter load impedance being included in the means for applying a control potential to the base of the AGC amplifying transistor.

10. In a radio receiver, a low-drain detector-amplifier comprising, in combination: an NPN type detector transistor having an emitter and a base and a collector; a PNP type audio amplifier transistor having an emitter and a base and a collector; a direct connection between the emitter of the detector transistor and the collector of the amplifier transistor; a source of bias currents having a negative terminal in circuit with said connection, a more negative terminal in circuit with the base of the detector transistor, and a positive terminal in circuit with a point of reference potential; a direct connection between the collector of the detector transistor and the base of the amplifier transistor; a temperature-stabilizing resistor connected between base and emitter of the amplifier transistor; and an emitter load connected in a direct current series circuit with said resistor between the emitter of the amplifier transistor and said point of reference potential.

References Cited in the file of this patent

UNITED STATES PATENTS

| | | |
|---|---|---|
| 2,012,433 | Myers | Aug. 27, 1935 |
| 2,840,699 | Carpenter | June 24, 1958 |

FOREIGN PATENTS

| | | |
|---|---|---|
| 413,383 | Great Britain | July 19, 1934 |
| 414,187 | Great Britain | Aug. 2, 1934 |
| 764,428 | Great Britain | Dec. 28, 1956 |

OTHER REFERENCES

"American Transistor Broadcast Receiver," Electronics, January 1956, page 180.

Publication "Electronics," July 1956, pages 120–124.